US007780266B2

(12) United States Patent
Andrews

(10) Patent No.: US 7,780,266 B2

(45) Date of Patent: Aug. 24, 2010

(54) MICRO-FLUIDIC DEVICE HAVING REDUCED MECHANICAL CROSS-TALK AND METHOD FOR MAKING THE MICRO-FLUIDIC DEVICE

(75) Inventor: John Richard Andrews, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 226 days.

(21) Appl. No.: 12/185,426

(22) Filed: Aug. 4, 2008

(65) Prior Publication Data

US 2010/0026761 A1 Feb. 4, 2010

(51) Int. Cl.

| | |
|---|---|
| ***B41J 2/14*** | (2006.01) |
| ***H01L 21/00*** | (2006.01) |
| ***H04R 17/00*** | (2006.01) |

(52) U.S. Cl. .......................... 347/50; 438/21; 29/25.35

(58) Field of Classification Search .................. 347/50; 438/21; 29/25.35

See application file for complete search history.

(56) References Cited

U.S. PATENT DOCUMENTS

| | | | | |
|---|---|---|---|---|
| 4,587,528 | A | 5/1986 | Beaudet | |
| 5,997,134 | A | 12/1999 | Hotomi et al. | |
| 6,332,672 | B1 | 12/2001 | Yazaki et al. | |
| 6,437,487 | B1 | 8/2002 | Mohr, III et al. | |
| 6,931,702 | B2 | 8/2005 | Mitsuhashi et al. | |
| 7,036,916 | B2 * | 5/2006 | Sakaida et al. | 347/68 |
| 7,059,703 | B2 * | 6/2006 | Nakamura | 347/29 |
| 7,108,360 | B2 | 9/2006 | Lu et al. | |
| 7,168,791 | B2 | 1/2007 | Hoisington et al. | |
| 7,196,456 | B2 | 3/2007 | Nakano et al. | |
| 7,290,336 | B2 | 11/2007 | Buhler et al. | |
| 2006/0214536 | A1 | 9/2006 | Sugahara | |

* cited by examiner

*Primary Examiner*—Evan Pert
(74) *Attorney, Agent, or Firm*—Maginot, Moore & Beck LLP

(57) ABSTRACT

A method processes electrical connections in a micro-fluidic device to reduce mechanical cross-talk and improve actuator performance. The method includes applying conductive adhesive to an electrode overlying a piezoelectric material, contacting the conductive adhesive with an electrical contact pad mounted to a support member to cover the electrode and piezoelectric material with the support member, and removing a portion of the support member that covers the electrical contact pad, the electrode, and the actuator.

20 Claims, 11 Drawing Sheets

MICRO-FLUIDIC DEVICE HAVING REDUCED MECHANICAL CROSS-TALK AND METHOD FOR MAKING THE MICRO-FLUIDIC DEVICE

TECHNICAL FIELD

This disclosure relates generally to micro-fluidic devices that eject fluid from a liquid supply in the device and, more particularly, to printheads that eject ink onto imaging substrates.

BACKGROUND

Many small scale liquid dispensing devices, sometimes called micro-fluidic devices, are known. These devices include micro-electromechanical system (MEMS) devices, electrical semiconductor devices, and others. These devices are small, typically in the range of 500 microns down to as small as 1 micron or even smaller. These devices are important in a wide range of application that include drug delivery, analytical chemistry, microchemical reactors and synthesis, genetic engineering, and marking technologies including a range of ink jet technologies, such as thermal ink jet and piezoelectric ink jet. Many of these devices have one or more displaceable devices, sometimes called actuators, which physically fluctuate to move fluid through the liquid dispensing device. These actuators typically include a material that responds to an electrical signal by expanding or contracting. For example, piezoelectric materials, such as lead-zirconium-titanate (PZT), may be sandwiched between two electrodes. In response to one of the electrodes receiving an electrical signal, an electrical field is established between the two electrodes and the PZT material physically moves. By positioning an actuator adjacent to a flexible membrane that follows the movement of the actuator, the flexible membrane is induced to move and expel liquid from a supply located next to the flexible membrane. In devices having multiple actuators, movement by one actuator may induce movement in a structure associated with another actuator. Consequently, the operation of the influenced actuator may be adversely impacted.

Modern printers incorporate printheads having a plurality of actuators that operate in a manner as described above to eject ink drops onto an imaging surface. The liquid ink may be stored in reservoirs installed into the printer or solid ink may be loaded as blocks or pellets into an ink delivery system. The delivery system transports the solid ink to a melting device where the solid ink is heated to a melting temperature and the melted ink is then collected. In both types of printers, the liquid ink is delivered to a printhead for ejection in a controlled pattern to generate an image.

The ejected ink is received on an imaging surface advancing past the print head. The imaging surface may be some form of media or an offset imaging member. In offset printing, the image is typically generated on a rotating offset member and subsequently transferred to media by synchronizing passage of media and rotation of the image on the member into a transfer nip formed between a transfix roller and the offset member. The printheads for liquid ink and solid ink printers typically include a plurality of micro-fluidic devices, called ink jet stacks, which are arranged in a matrix within the print head. Each ink jet stack has an array of nozzles from which ink is ejected by applying an electrical driving signal to one of the actuators in the array in the ink jet stack to generate a pressure pulse that expels ink from an ink supply in the ink jet stack.

A partially assembled ink jet stack is shown in a cross-sectional side view in FIG. 13. The ink jet stack 10 may be comprised of a number of plates that are mounted to one another. For example, the ink jet stack 10 may include a nozzle plate 14, an inlet plate 18, a body plate 22, and a diaphragm plate 26. These plates are assembled and bonded to one another using brazing or adhesives in a known manner to form ink jet stack 10. Additionally, other layers, such as filters, heating layers, or the like, may be included in the stack. Alternatively, an ink jet stack may be made from subassemblies, some of which are molded or formed by other processes, such as lithography or etching. These ink jet stacks may be formed with a structure similar to the one shown in FIG. 13. Regardless of the fabrication method, ink supplies 34 receive ink from an ink source through inlets 38. In response to the input of electrical energy provided through conductive adhesive 46 and an electrical contact pad 50, actuator 42 moves to induce movement in the diaphragm 26 mounted to the actuator. The diaphragm plate 26 is made of a resilient, flexible material, such as stainless steel, which enables the plate to move back and forth to expel ink in one direction of movement and to induce movement of ink into the ink supplies 34 in the other direction of movement. The ink expelled from an ink supply 34 exits through one of the openings 30 in the nozzle plate 14.

The electrical contact pad 50 is mounted to a support member 54, such as a flex cable or a multi-layer circuit board, which is partially supported by standoffs 58, which are also mounted to the support member 54. The actuator 42 may include piezoelectric material, such as lead-zirconium-titanate (PZT), which is sandwiched between two electrode structures, which may be made of nickel, for example. An electrical signal generated by a printhead controller is conducted by an electrical lead integrally formed with the electrical contact pad 50 to the conductive adhesive and the electrode contacting the adhesive. The charge on the electrode results in an electric field between the two electrodes on opposite sides of the PZT material. In response to the electric field, the PZT material deflects as shown in FIG. 14 and moves the diaphragm as well. In FIG. 14, the actuator material 42*a* and the portion of the diaphragm 26*a* immediately adjacent to the actuator material has moved to induce ink to be pulled into the ink supply 34*a*, while the actuator material 42*b* and the portion of the diaphragm 26*b* immediately adjacent that actuator material is moved to expel ink from the ink supply 34*b*. Thus, a printhead controller selectively generating an electrical signal is able to cause an ink jet stack to eject ink in an on-demand manner.

As may be discerned from FIG. 14, the deflection of the actuator material produces a force that primarily acts upon the diaphragm to expel ink from or pull ink into an ink supply 34. This force also operates on the conductive adhesive 46, the electrical contact 50, and the support member 54. This operation is a mechanical load and a parasitic force on the electrical connections that decreases the deflection of the actuator and, hence the force available for manipulation of the ink. In known printheads, this parasitic action is compensated by increasing the voltage for the driving signal, the size of the actuator, or other alterations of the stack structure. The size of the conductive adhesive, which may be silver epoxy or z-axis conductive tape, for example, the distance between the actuator material 42 and the contact pad 50, and the location of the conductive adhesive with respect to each actuator and pad, are all factors that can vary across the array of ink jets in a printhead. These variations, in turn, cause the mechanical loads on the actuator materials and the corresponding driving signal voltages that generate similarly sized ink drops from each ink jet to vary as well. These driving signal voltages that generate similarly sized ink jets are determined in a process known as normalization. These voltages are stored in a memory and later retrieved and used by the printhead controller to operate the ink jets in a printhead.

Determining the different driving voltages in a normalization process requires an application specific integrated circuit (ASIC), additional memory, and a portion of the printer set-up. Additionally, compensating for the differences between the ink jets in a printhead adds to the overhead for operating a printhead. As the number of nozzles in a printhead increases, these costs also increase. Thus, decreasing the differences between the structure of ink jet stacks for individual jets is worthwhile. Additionally, the transmission of shear stress from one ink jet to another through the support member also impacts the operation of the ink jets and may result in mechanical cross-talk. Such cross-talk may render an actuator's performance dependent upon whether neighboring actuators are being actuated. Moreover, cyclic stresses caused by the repeated deflections of the actuator material may, depending on the particular geometry of the structure in a particular ink jet, lead to damage to the actuator, the electrical contact pad, and/or the conductive adhesive. Consequently, more uniform ink jet body structure is desirable.

SUMMARY

A method further processes established electrical connections in a micro-fluidic device to remove a support member from an electrical contact pad coupled to an actuator electrode by a conductive adhesive. The method includes applying conductive adhesive to an electrode overlying a piezoelectric material, contacting the conductive adhesive with an electrical contact pad mounted to a support member to cover the electrode and piezoelectric material with the support member, and removing a portion of the support member that covers the electrical contact pad, the electrode, and the actuator.

The method may be used to construct a micro-fluidic device that reduces mechanical cross-talk between actuators. The micro-fluidic device includes an actuator coupled to a portion of the diaphragm, at least one standoff member resting on the actuator, a support member resting on the at least one standoff member, an electrical contact pad mounted to a surface of the support member, a portion of the electrical contact pad extending past an edge of the support member to cover a portion of the actuator, and a conductive adhesive that electrically couples the actuator to the electrical contact pad. The micro-fluidic device may be configured as an ink jet stack.

BRIEF DESCRIPTION OF THE DRAWINGS

The foregoing aspects and other features of a method for finishing electrical connections in a micro-fluidic device and the micro-fluidic device produced by such a method are explained in the following description, taken in connection with the accompanying drawings.

DETAILED DESCRIPTION

Figure 1:
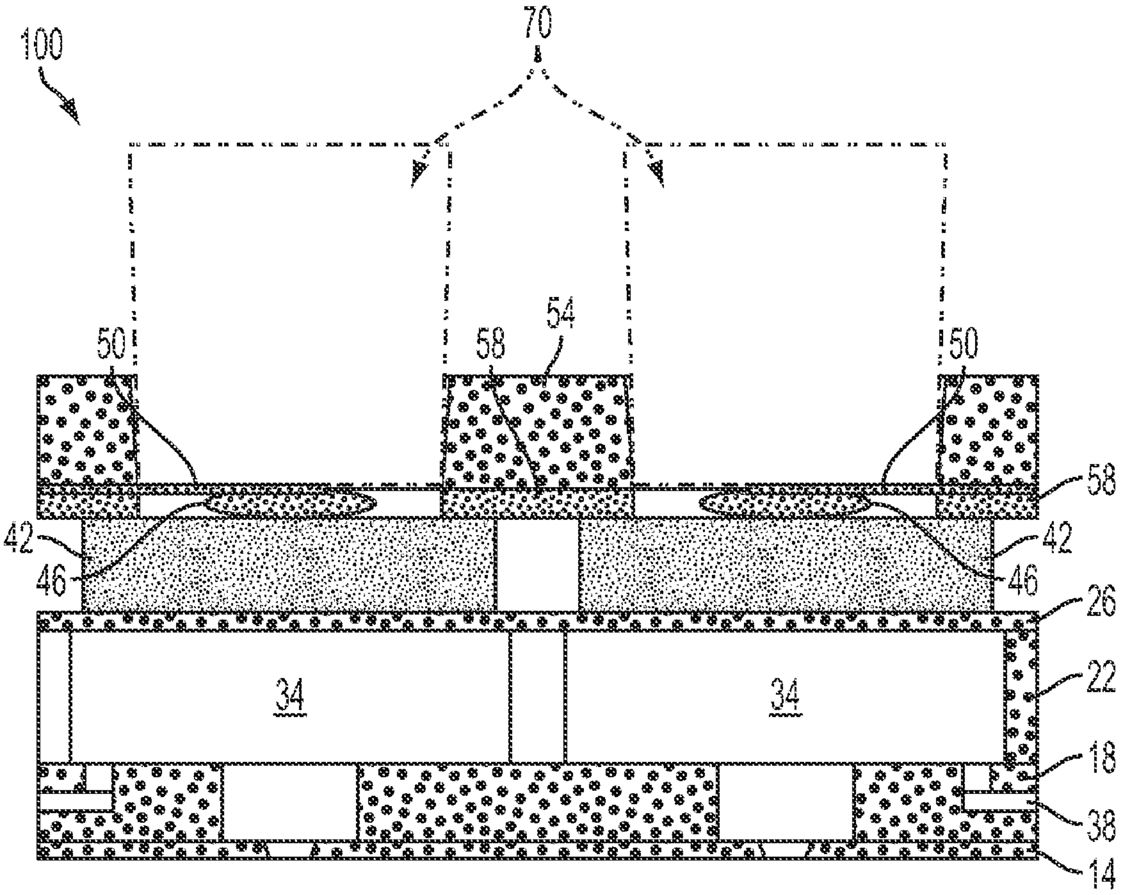
FIG. 1 is a diagram of an ink jet stack that is being laser ablated to remove a portion of a support member above an electrical contact pad and actuator in the ink jet stack.

For a general understanding of the environment for the system and method disclosed herein as well as the details for the system and method, reference is made to the drawings. In the drawings, like reference numerals have been used throughout to designate like elements. As used herein, the word "printer" encompasses any apparatus that performs a print outputting function for any purpose, such as a digital copier, bookmaking machine, facsimile machine, a multi-function machine, etc. Other "printer operations may include printing electronic structures, three-dimensional objects, conducting biological or chemical assays or reactions, or the like. In the description below, reference is made in the text and the drawings to an ink jet stack, however, the discussion is applicable to other micro-fluidic devices that use a plurality of displaceable members to move liquid through the device. Therefore, the description should not be read to limit the application of the method to ink jet stacks alone.

Figure 13:
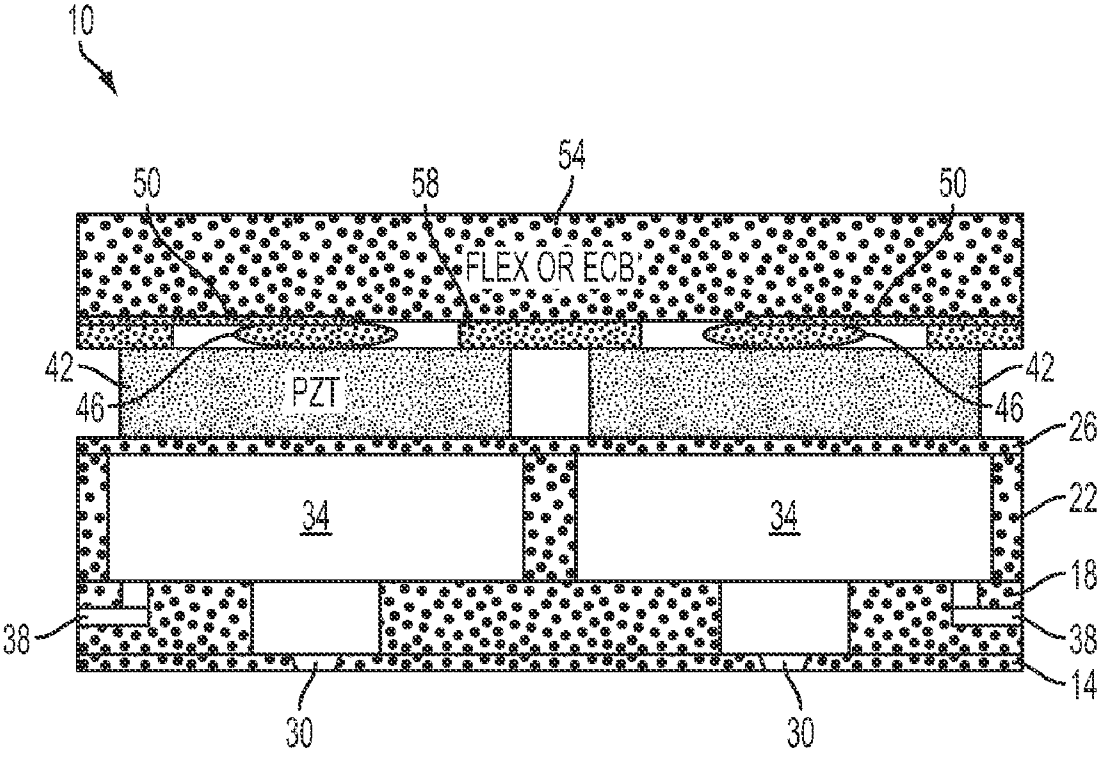
FIG. 13 PRIOR ART
FIG. 13 is a view of a partially assembled ink jet stack having a support member that enables mechanical cross-talk between ink jets.
Figure 14:
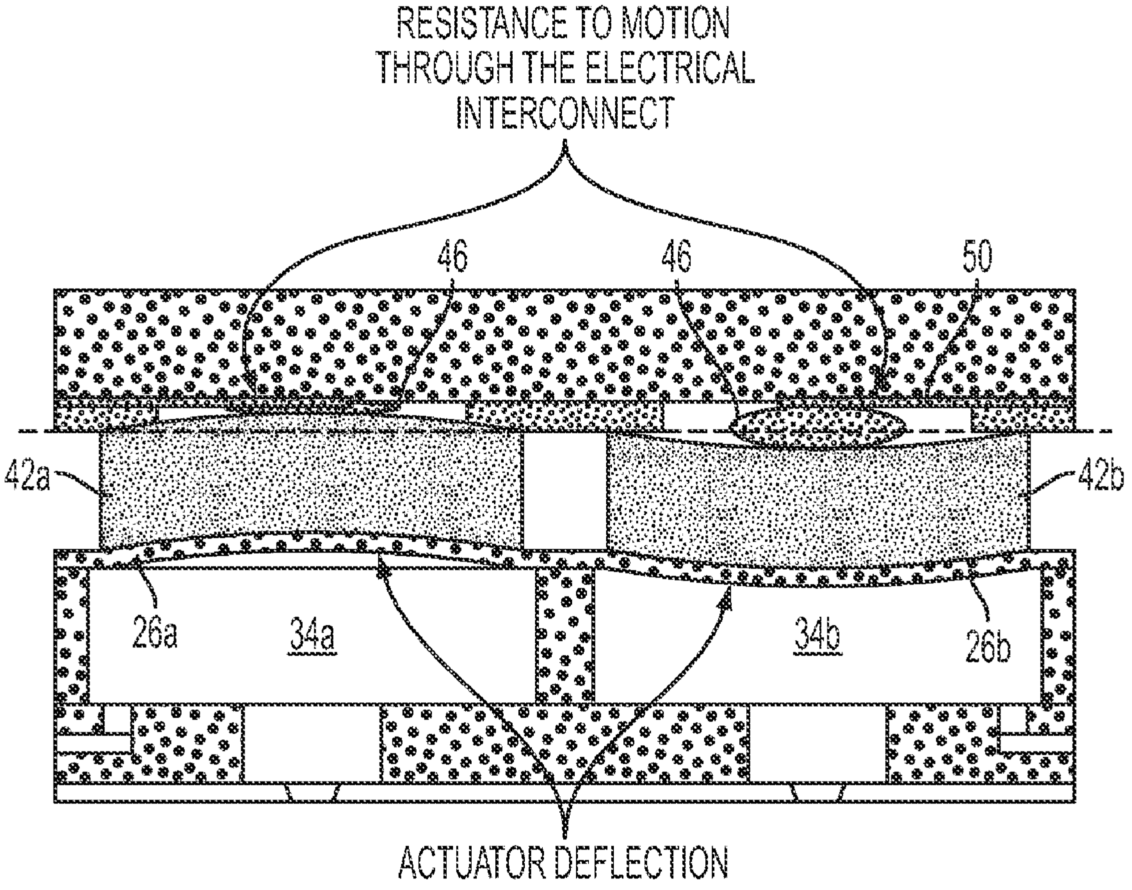
FIG. 14 PRIOR ART
FIG. 14 is a view of the ink jet stack in FIG. 13 that shows the actuator in deflection and the mechanical loads induced by the support member.

FIG. 1 depicts an inkjet stack 100 that is being finished to reduce mechanical coupling in the ink jet stack. The ink jet stack 100 has been partially assembled as shown in FIG. 13 before the finishing operation begins. After the electrical connections have been established, a laser 70 is used to etch away the support member 54 that is directly between the laser and the actuator 42. For example, the polymer of a flex cable or layers of a multi-layer circuit board are removed by an image-wise laser, such as an excimer laser, or the beam of a carbon dioxide ($CO_2$) laser may be operated in a scan over the upper surface of the support member 54 to illuminate predetermined positions on the board. The predetermined positions coincide with the actuators 42 in the ink stack body being constructed. The laser ablates the support member 54 at those positions to form recesses over the electrical contact pads and actuators. The support member 54 is most frequently a polyimide having a thickness of about 25 microns to about 50 microns. The metal from which the electrical contact pad 50 and the upper electrode of the actuator 42 are made act as stops to the etching effect of the laser. Thus, the polymer material is removed without substantial risk of damage to the electrical leads. Most frequently, the electrical contact pad and its conductor 50 mounted to the support member 54 are copper, while the electrodes of the actuator 42 are made from nickel.

Figure 2:
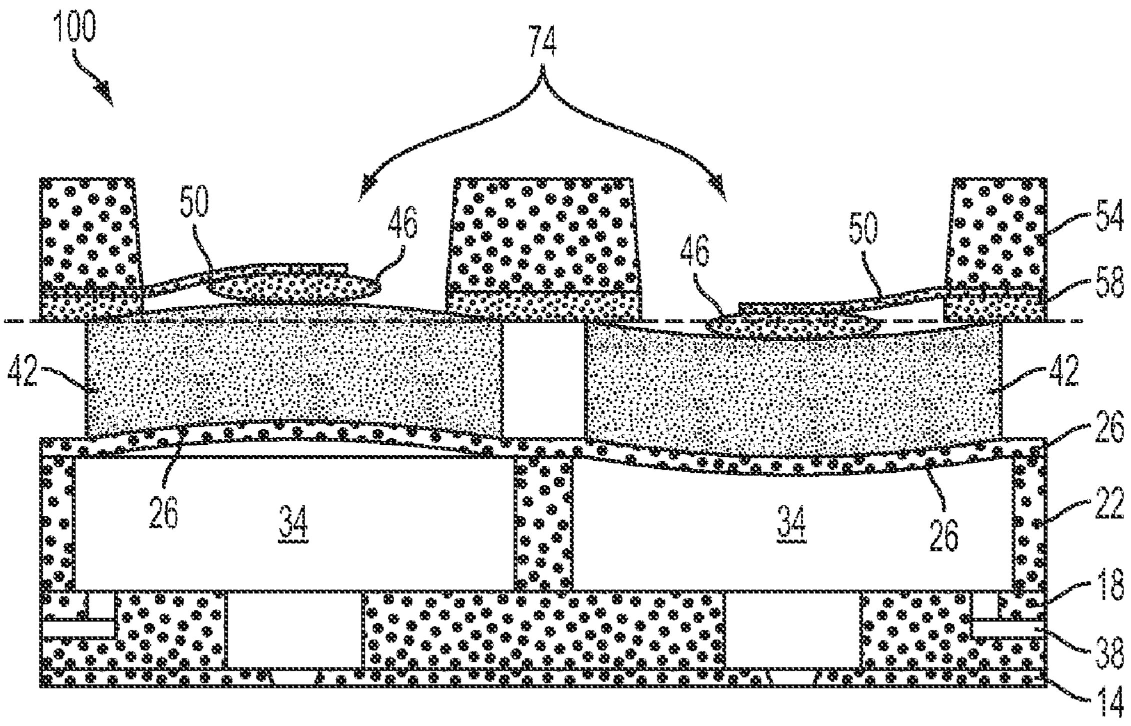
FIG. 2 is a diagram of the ink jet stack in FIG. 1 after the laser ablation has finished removal of the support member material.

After the process has been performed, the ink jet stack 100 has the structure shown in FIG. 2. In this finished ink stack, a diaphragm 26 overlies an ink supply area 34 in the ink jet stack. Actuators 42 are coupled to a portion of the diaphragm 26, and standoff members 58 rest on the actuator 42. An electrical contact pad 50 is mounted to a surface of the support member 54 with a portion of the electrical contact pad 50 extending past an edge of the support member 54 to cover a portion of the actuator 42. A conductive adhesive 46 electrically couples the actuator 42 to the electrical contact pad 50. A portion of the support member 54 is adjacent the standoffs 58, but the support member 54 is no longer above the electrical contact pad 50 that overlies the actuator 42 and the conductive adhesive 46. Instead, recesses 74 are now above the electrical contact pad 50, conductive adhesive 46, and the actuator 42. As discussed above, the support member 54 may be a flex cable or a multi-layer circuit board, such as a glass-filled circuit board. The metal of the electrical contact pad, copper, for example, and the metal of the upper electrode of the actuator, nickel, for example, have stopped the laser from etching the structure of the electrical connections.

Figure 3:
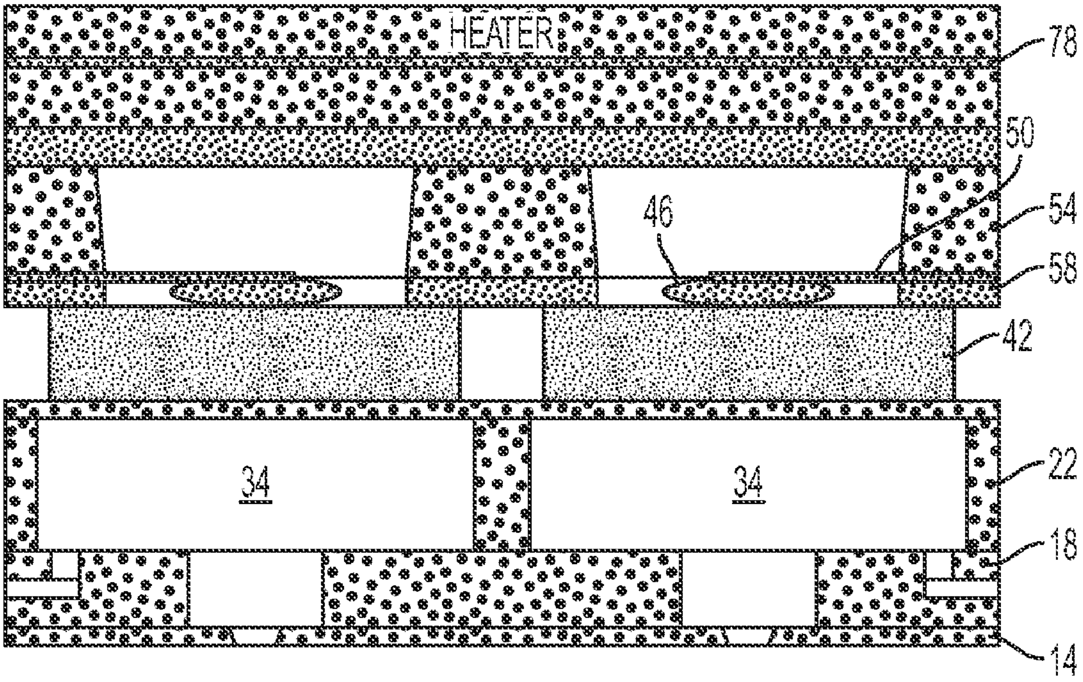
FIG. 3 is a diagram of the ink jet stack of FIG. 2 with a flex heater bonded to the ink jet stack after the laser ablation operation.

For purposes of illustration, the ink jet stack of FIG. 2 is depicted as being actuated to expel ink on the right side and as being actuated to induce refilling of an ink supply on the left side. Both deflections may now occur without the support member 54 located directly above the actuators 42 and the electrical contact pads 50 to load the actuators mechanically. Additionally, the deflection in one ink jet is severely attenuated from influencing an adjacent ink jet because the only remaining mechanical leakage through the support member is the electrical contact pad 50. This mechanical coupling is much smaller than the coupling through the support member portion that was removed because the flexibility and length of the electrical contact pad and its conductor do not transmit the deflection force as efficiently. The ink stack of FIG. 2 may be further finished by the addition of a flex heater 78 as shown in FIG. 3. In this configuration, the actuators 42 remain mechanically decoupled from the surrounding ink jets because the space above the actuators and the electrical contact pads remain open.

Figure 4:
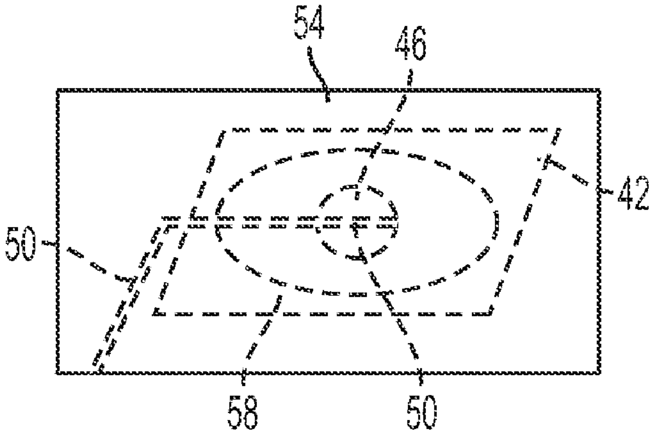
FIG. 4 is a plan view of the ink jet stack before the support member material is removed.
Figure 5:
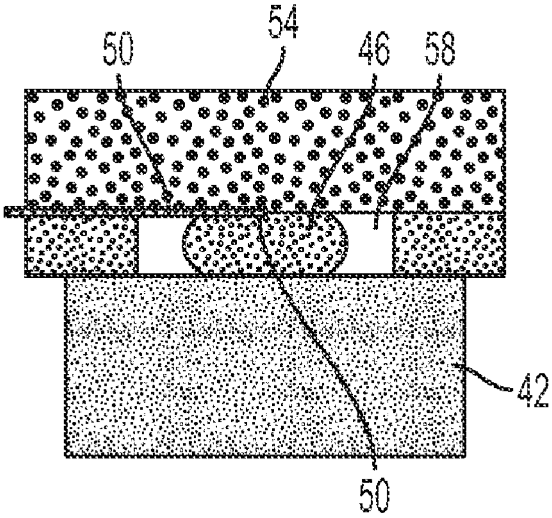
FIG. 5 is a partial cross-sectional view of the ink jet stack in FIG. 4.
Figure 6:
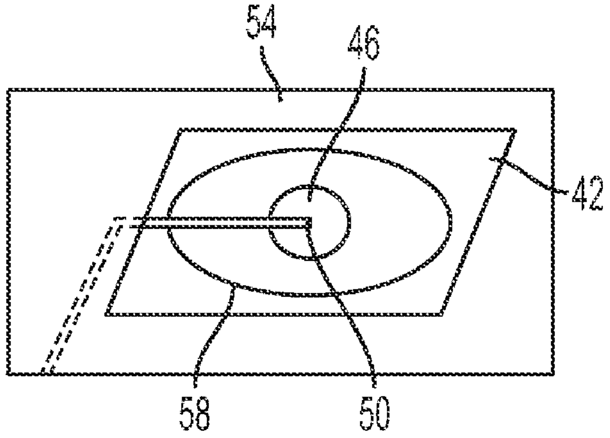
FIG. 6 is a plan view of the ink jet stack after laser ablation has removed a portion of the support member material that is located above the electrical contact pad and actuator of the ink jet stack.
Figure 7:
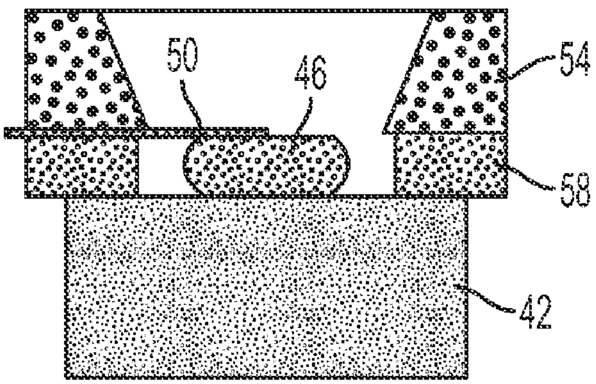
FIG. 7 is a partial cross-sectional view of the ink jet stack in FIG. 6.
Figure 8:
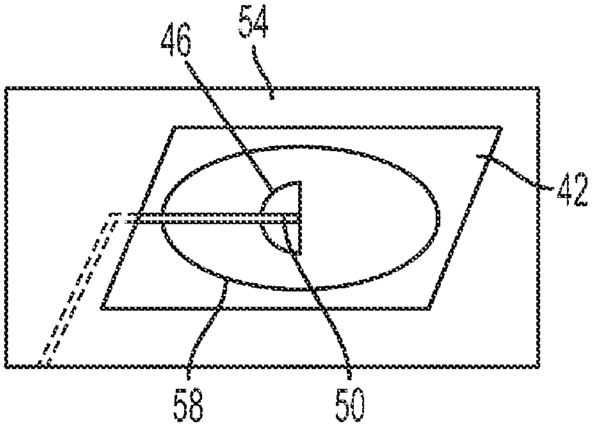
FIG. 8 is a plan view of the ink jet stack after further laser ablation has removed a portion of the conductive adhesive that is beyond a lateral perimeter of the electrical contact pad.
Figure 9:
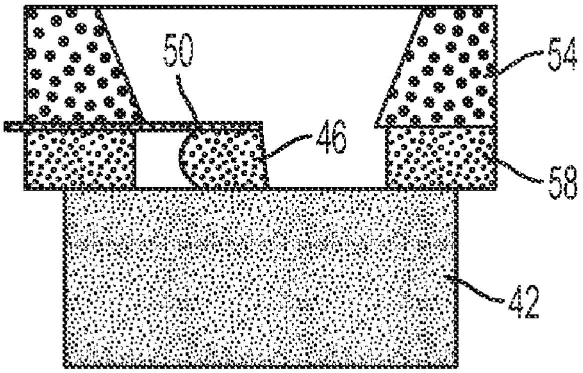
FIG. 9 is a partial cross-sectional view of the ink jet stack in FIG. 8.

Plan views of the ink jet stack from above the stack are shown in FIG. 4, FIG. 6, and FIG. 8. Corresponding cross-sectional views are shown in FIG. 5, FIG. 7, and FIG. 9. In FIG. 4 and FIG. 5, the ink jet stack has completed electrical connections between the electrical contact pad 50 and the actuator 42. In these figures, the actuators 42 and the electrical contact pads 50 are completely covered by the support member 54. The electrical contact pad 50 includes an electrical conductor that is mounted to the support member 54 and extends to a position outside the support member (not shown) where the conductor can be electrically coupled to printhead controller. While the electrical contact pad 50 is shown as being an enlarged termination for the conductor, it may be a simple termination of the conductor without any enlargement. Additionally, the shape of the electrical contact pad may be geometrical shapes other than the circular one shown in the figures. Likewise, the conductor need not be arranged in a straight line pattern as other configurations may be used for the conductor path.

FIG. 6 and FIG. 7 show the ink jet stack after the laser has etched a portion of the support member 54 from the electrical contact pad 50. FIG. 8 and FIG. 9 show that further exposure to the laser may be used to remove a portion of the conductive adhesive 46 that does not lie directly underneath the electrical contact pad 50. That is, the portion of the conductive adhesive that extends beyond a lateral perimeter of the electrical contact as shown in the plan views is removed by the laser after the support member portion in the path of the laser has been removed. This additional etching enables tailoring of the electrical connections to provide reliable electrical coupling, while minimizing excess mass that may contribute to parasitic forces during actuator deflections.

Figure 10:
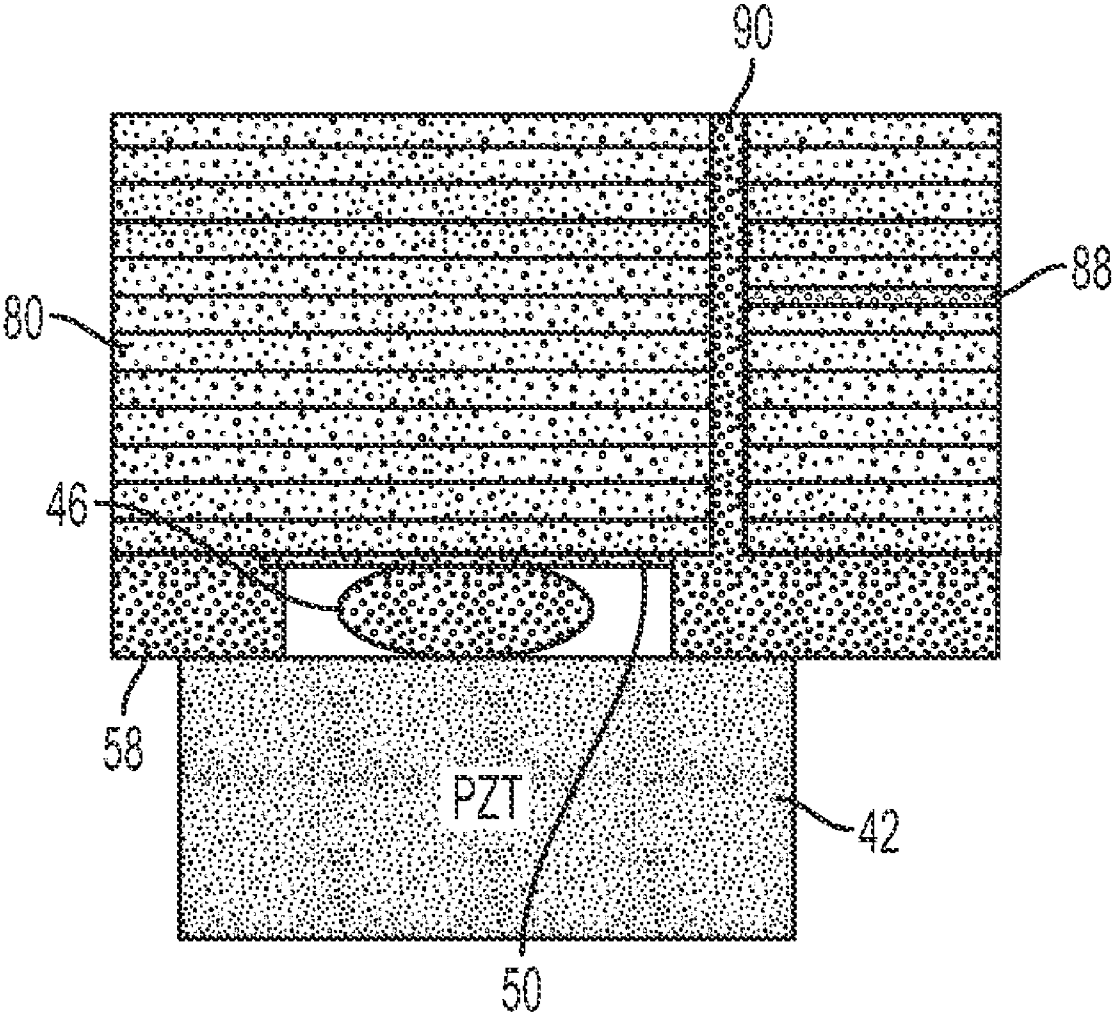
FIG. 10 is a side view of an ink jet stack that has a multi-layer support member mounted to an upper surface of the standoffs.

While the processes described above have been discussed with reference to laser ablation, other etching processes, such as wet and dry etching processes may be used to remove the support member portion overlying an actuator. Also, the etching process may be adjusted for removing a support member that is a multi-layer circuit board rather than a flex cable. With glass-filled circuit boards, carbon dioxide lasers are especially effective for removal of the support member material like FR4. The multilayer structure of a circuit board 80 is shown in FIG. 10. While a carbon dioxide laser does effectively remove the board material, it is also capable of removing the nickel electrode on the upper surface of the actuator 42. Thus, precise control of the beam position and duration may be used to reduce the likelihood of damage to the actuator.

Figure 11:
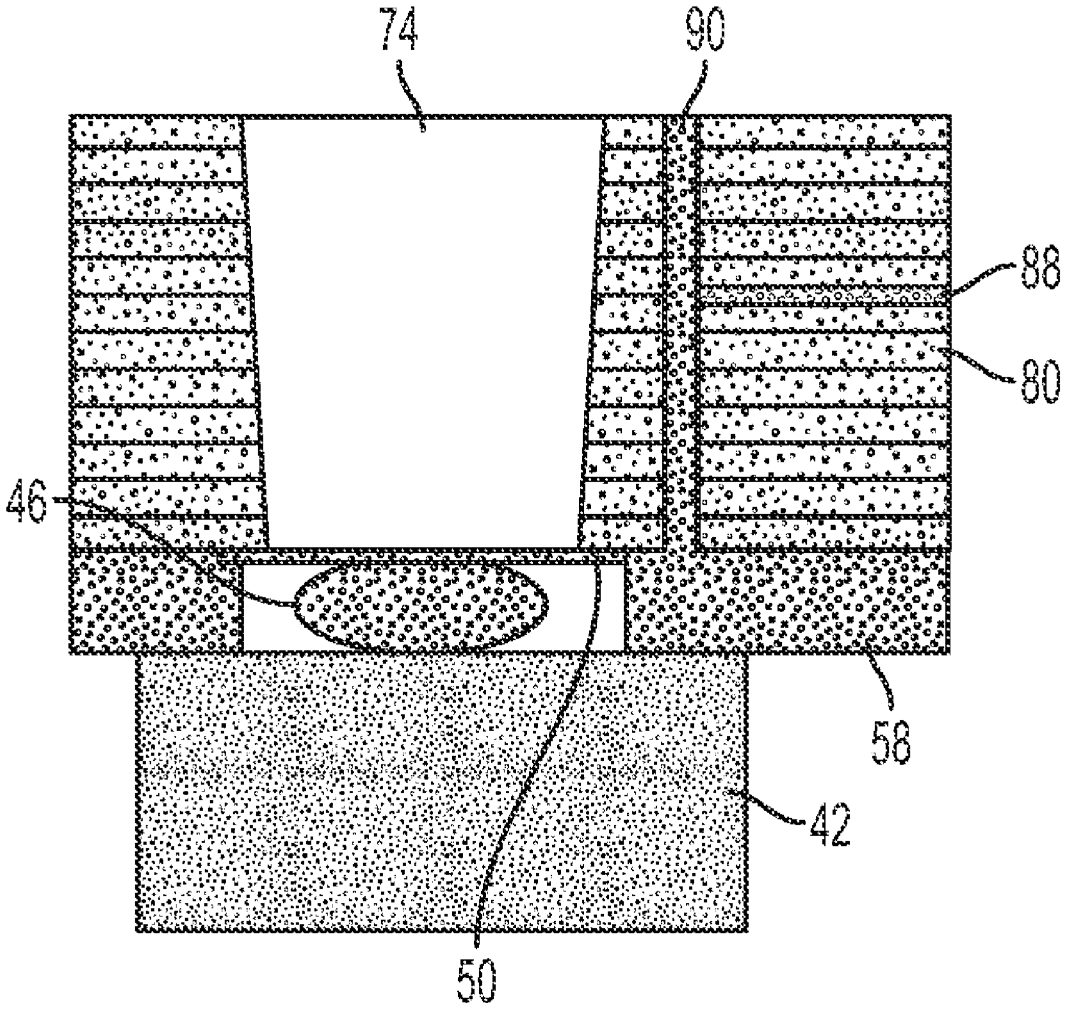
FIG. 11 is a side view of the ink jet stack in FIG. 10 after the multi-layer circuit board above the electrical contact pad has been removed by etching.

Another approach provides more latitude in the control of the laser by taking advantage of the ability of the copper and other relatively thick metal layers in the conductor 88 and electrical contact pad 50 to act as an effective stop to a carbon dioxide laser. By increasing the size of the electrical contact pad 50 so it covers the entire area to be etched, the pad helps shield the actuator structure from the $CO_2$ laser radiation. The electrical contact pad 50 shown in FIG. 10 is a larger pad that illustrates this approach. The pad 50 is electrically coupled to the conductor 88 through the via 90. The copper or other metal forming the electrical contact pad 50 is a low modulus thin layer of copper. Additionally, the via 90 and the conductor 88 need to be placed so they do not interfere with the laser ablation in the area above the electrical contact pad. In some ink stack configurations, these requirements may necessitate additional layers in the circuit board. Once the laser ablation takes place, the area above the electrical contact pad 50 and actuator 42 becomes a recess 74 as shown in FIG. 11. This structure reduces the voltage required to deflect the diaphragm 26 by an appropriate amount and attenuates mechanical coupling between ink jets.

Figure 12:
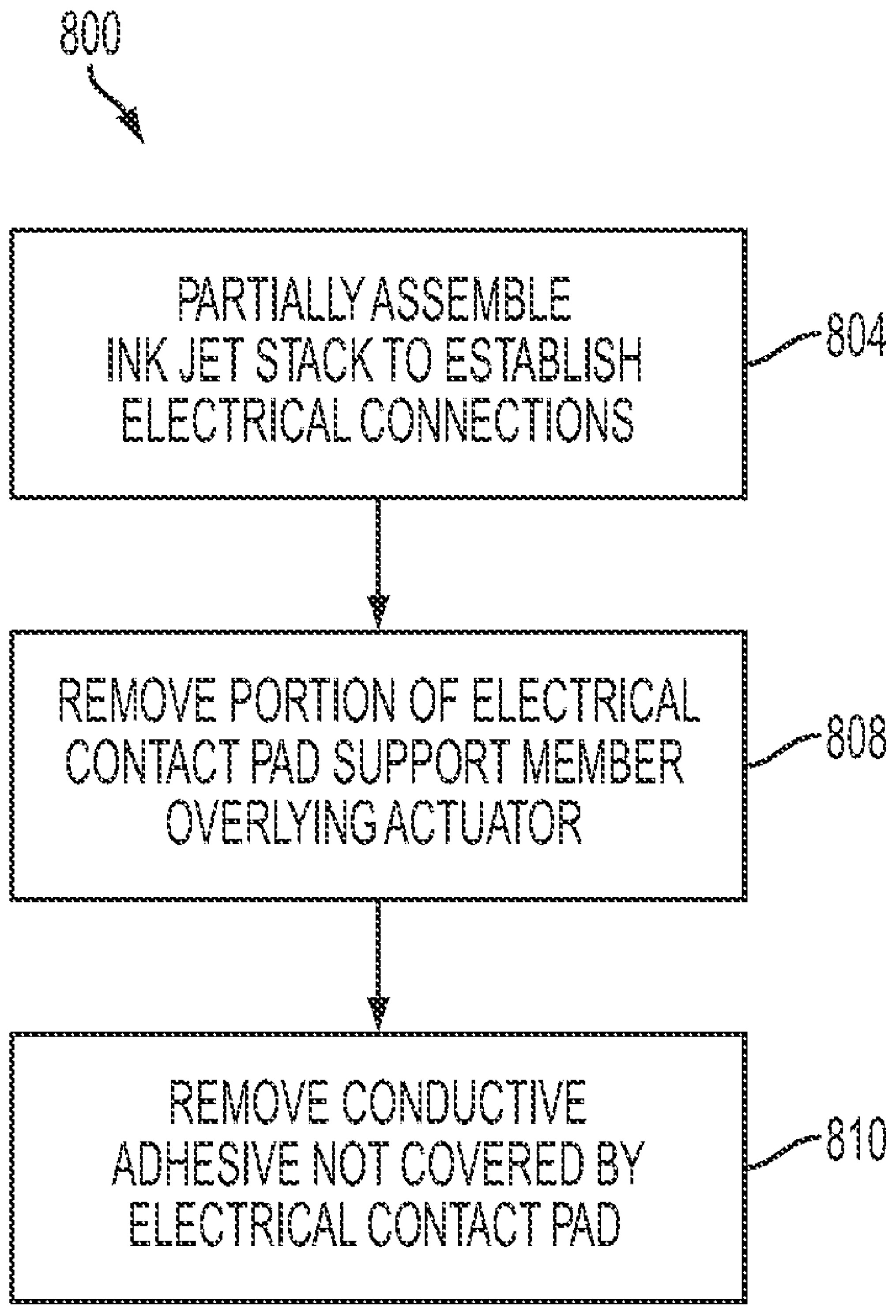
FIG. 12 is a flow diagram of a method for altering the structure of an ink jet stack by removing a portion of the support member above an electrical contact pad.

A method that modifies an ink jet stack to attenuate mechanical cross-talk and help keep actuation voltages in tighter range is shown in FIG. 12. The method 800 begins with the partial assembly of an ink jet stack to establish the electrical connections between the electrical contact pad and the actuator of an ink jet stack (block 804). A portion of the support member is then removed to expose the electrical contact pad and the actuator (block 808). The support member may be removed by radiating the support member with a laser to etch the portion of the support member that is removed. The laser may be an excimer laser, and a carbon dioxide laser in particular. The portion of the support member removed may be a portion of a flex cable or a multi-layer circuit board. The laser may be operated for a sufficient period of time to remove a portion of the conductive adhesive that does not underlie the electrical contact pad (block 808).

The methods disclosed herein may be implemented by a processor being configured with instructions and related circuitry to control the operations of a laser ablation system in an image-wise manner. Additionally, the processor instructions may be stored on computer readable medium so they may accessed and executed by a computer processor to perform the methods for controlling a laser to ablate support member material from an area between the laser and an electrical contact pad that is electrically coupled to an actuator.

It will be appreciated that various of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. A method for processing electrical connections in a micro-fluidic device comprising:

coupling an electrical contact pad mounted to a support member to an actuator with conductive adhesive; and removing a portion of the support member to expose the electrical contact pad and the actuator.

2. The method of claim 1, the support member removal comprising:

radiating the support member with a laser to etch the portion of the support member removed.

3. The method of claim 2 wherein the laser is an excimer laser.

4. The method of claim 2 wherein the laser is a carbon dioxide laser.

5. The method of claim 1 wherein the support member is a flex cable.

6. The method of claim 1 wherein the support member is a multi-layer circuit board.

7. The method of claim 1 further comprising:

removing a portion of the conductive adhesive that does not underlie the electrical contact pad.

8. A micro-fluidic device comprising:

a diaphragm that overlies a liquid supply in a liquid dispensing device;

an actuator coupled to a portion of the diaphragm;

at least one standoff member resting on the actuator;

a support member resting on the at least one standoff member;

an electrical contact pad mounted to a surface of the support member, a portion of the electrical contact pad extending past an edge of the support member to cover a portion of the actuator; and a conductive adhesive that electrically couples the actuator to the electrical contact pad.

9. The micro-fluidic device of claim 8 wherein the support member is a flex cable.

10. The micro-fluidic device of claim 8 wherein the support member is a multi-layer circuit board.

11. The micro-fluidic device of claim 10 wherein the multi-layer circuit board is a glass-filled circuit board.

12. The micro-fluidic device of claim 8 wherein the conductive adhesive does not extend beyond a lateral perimeter of the electrical contact pad.

13. The micro-fluidic device of claim 8 wherein the electrical contact pad is made of copper.

14. The micro-fluidic device of claim 8 wherein the actuator is a piezoelectric material sandwiched between two electrodes and one electrode is electrically coupled to the electrical contact pad by the conductive adhesive.

15. A method for finishing electrical connections in a micro-fluidic device comprising:

applying conductive adhesive to an electrode overlying an actuator formed of a piezoelectric material;

contacting the conductive adhesive with an electrical contact pad mounted to a support member to cover the electrode and piezoelectric material with the support member; and removing a portion of the support member that covers the electrical contact pad, the electrode, and the actuator.

16. The method of claim 15, the support member removal comprising:

ablating the support member with a laser to remove the portion of the support member from the electrical contact pad.

17. The method of claim 16 wherein the laser ablation of a portion of the support member is implemented with a carbon dioxide laser.

18. The method of claim 16 further comprising:

ablating a portion of the conductive adhesive.

19. The method of claim 16 further comprising:

cutting the electrical contact pad to a predetermined shape with the laser.

20. An ink jet stack for a printhead comprising:

a diaphragm that overlies a liquid ink supply in an ink jet printhead;

an actuator coupled to a portion of the diaphragm;

at least one standoff member resting on the actuator;

a support member resting on the at least one standoff member;

an electrical contact pad mounted to a surface of the support member, a portion of the electrical contact pad extending past an edge of the support member to cover a portion of the actuator; and a conductive adhesive that electrically couples the actuator to the electrical contact pad to enable the actuator to receive an electrical driving signal from a printhead controller to eject ink from the ink supply.

* * * * *